United States Patent
Lee et al.

(10) Patent No.: US 7,582,520 B2
(45) Date of Patent: Sep. 1, 2009

(54) METHOD OF FABRICATING COMPLEMENTARY METAL-OXIDE-SEMICONDUCTOR TRANSISTOR AND METAL-OXIDE-SEMICONDUCTOR TRANSISTOR

(75) Inventors: Kun-Hsien Lee, Tainan (TW); Cheng-Tung Huang, Kaohsiung (TW); Li-Shian Jeng, Taitung (TW); Wen-Han Hung, Kaohsiung (TW); Shyh-Fann Ting, Gangshan Township, Kaohsiung County (TW); Jing-Yi Huang, Kaohsiung (TW); Tzyy-Ming Cheng, Hsinchu (TW); Chia-Wen Liang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 295 days.

(21) Appl. No.: 11/490,210

(22) Filed: Jul. 19, 2006

(65) Prior Publication Data
US 2008/0020523 A1 Jan. 24, 2008

(51) Int. Cl.
H01L 21/336 (2006.01)
H01L 21/8234 (2006.01)
H01L 21/3205 (2006.01)
H01L 21/4763 (2006.01)

(52) U.S. Cl. .................. 438/197; 438/585; 438/587; 438/305

(58) Field of Classification Search ................ 438/197, 438/238, 399, 386, 585, 587, 303, 305–307, 438/239, 199
See application file for complete search history.

(56) References Cited

U.S. PATENT DOCUMENTS

| 5,726,071 | A | 3/1998 | Segawa et al. | 438/231 |
|---|---|---|---|---|
| 6,458,643 | B1 * | 10/2002 | Lai et al. | 438/231 |
| 6,512,258 | B2 * | 1/2003 | Maeda | 257/303 |
| 6,559,015 | B1 | 5/2003 | Yu | 438/301 |
| 6,797,593 | B2 | 9/2004 | Chakravarthi et al. | 438/514 |
| 7,202,120 | B2 * | 4/2007 | Shima et al. | 438/153 |
| 2003/0094636 | A1 | 5/2003 | Maeda | 257/288 |
| 2004/0198004 | A1 * | 10/2004 | Tran | 438/289 |

* cited by examiner

Primary Examiner—Chuong A. Luu
(74) Attorney, Agent, or Firm—J.C. Patents

(57) ABSTRACT

A method of fabricating a metal-oxide-semiconductor transistor is provided. A first gate structure and a second gate structure are formed on a substrate. The first gate structure has a dimension greater than the second gate structure. Then, first lightly doped drain regions are formed in the substrate on two sides of the first gate structure. A lightly doped drain annealing process is performed. Next, second lightly doped drain regions are formed in the substrate on two sides of the second gate structure. First spacers are formed on the sidewalls of the first gate structure and second spacers are formed on the sidewalls of the second gate structure at the same time. Afterwards, first source/drain regions are formed in the substrate on two sides of the first spacers and second source/drain regions are formed in the substrate on two sides of the second spacers. A source/drain annealing process is performed.

27 Claims, 15 Drawing Sheets

METHOD OF FABRICATING COMPLEMENTARY METAL-OXIDE-SEMICONDUCTOR TRANSISTOR AND METAL-OXIDE-SEMICONDUCTOR TRANSISTOR

BACKGROUND OF THE INVENTION

1. Field of the Invention

The present invention relates to a method of fabricating integrated circuit device, and more particularly, to a method of fabricating a complementary metal-oxide-semiconductor (CMOS) transistor and a metal-oxide-semiconductor (MOS) transistor.

2. Description of Related Art

Metal-oxide-semiconductor (MOS) transistor is a basic device in logic circuits. Each transistor comprises a gate, a source/drain (S/D) region in the substrate on two sides of the gate, and a channel between the source region and the drain region. When the manufacturing of MOS transistor is progressed into the micrometer level, short channel effect and hot carrier effect is intensified due to the shortening of the channel between source/drain regions. The short channel effect and hot carrier effect is so devastating that the device can hardly operate normally. Therefore, a lightly doped drain (LDD) structure is often introduced into the design of the source/drain regions of a transistor for processes at the micrometer level or below. In other words, a lightly doped drain region having the same doping state as the source/drain region but a shallower depth is formed under the gate structure adjacent to the source/drain region so that the electric field in the channel is lowered and short channel effect and hot carrier effect is avoided.

In general, devices with different functions, for example, input/output (I/O) transistors (serving as on/off switches) and core transistors, are disposed on the same chip. According to their sizes, the I/O transistors are classified as large devices and the core transistors are classified as small devices.

However, as the size of MOS transistors drops below the deep sub-micron level, the size of core transistors is reduced with each advance in the processing technique but the size of the I/O transistors is almost unchanged. As a result, for the LDD structure in devices having a different size, the range of diffusion in a subsequent annealing process must be carefully controlled. Otherwise, the diffusion regions in the LDD structures of the devices may be either too large or too small due to their different sizes. An inappropriately fabricated diffusion region in the LDD structure may affect the electrical properties of the device and lead to device failure. In particular, since the dimension of each device is already so small, too much lateral diffusion will lead to short channel effect or punch through problems. On the other hand, for larger devices, too little lateral diffusion will lead to a high impedance at the overlapping region between the LDD and the gate, thereby lowering the saturated drain current and affecting the performance of the device.

In addition, a few other U.S. Patents, for example, U.S. Pat. No. 5,726,071, U.S. Pat. No. 6,458,643, U.S. Pat. No. 6,797,593 and U.S. Pat. No. 6,559,015, have also disclosed some related techniques and can serve as reference material in the present invention.

At present, with the rapid development of semiconductor processes, an efficient method of producing LDD structures suitable for devices of different dimensions on a wafer is one of the most important issues.

SUMMARY OF THE INVENTION

Accordingly, at least one objective of the present invention is to provide a method of fabricating a metal-oxide-semiconductor (MOS) transistor capable of producing lightly doped drain (LDD) structures for devices having different dimensions so that the production of too large or too small diffusion regions in the LDD structures of different size devices, which may lead to possible problems such as short channel effect or punch through and deterioration of the electrical properties of the device with consequential degradation of device performance, can be avoided.

Another objective of the present invention is to provide a method of fabricating a complementary metal-oxide-semiconductor (CMOS) transistor capable of producing lightly doped drain (LDD) structures for devices having different dimensions so that the production of too large or too small diffusion regions in the LDD structures of different size devices and related problems can be avoided.

Yet another objective of the present invention is to provide a method of fabricating a complementary metal-oxide-semiconductor (CMOS) transistor similarly capable of producing lightly doped drain (LDD) structures for devices having different dimensions so that the production of too large or too small diffusion regions in the LDD structures of different size devices and related problems can be avoided.

To achieve these and other advantages and in accordance with the purpose of the invention, as embodied and broadly described herein, the invention provides a method of fabricating a metal-oxide-semiconductor (MOS) transistor. The method includes forming a first gate structure and a second gate structure on a substrate. The first gate structure has a dimension greater than the second gate structure. Then, first lightly doped drain regions are formed in the substrate on two sides of the first gate structure. After that, a lightly doped drain annealing process is performed. Next, second lightly doped drain regions are formed in the substrate on two sides of the second gate structure. First spacers are formed on the sidewalls of the first gate structure and second spacers are formed on the sidewalls of the second gate structure at the same time. Afterwards, first source/drain regions are formed in the substrate on two sides of the first spacers and second source/drain regions are formed in the substrate on two sides of the second spacers. Finally, a source/drain annealing process is performed.

According to the method of fabricating a MOS transistor in one embodiment of the present invention, the lightly doped drain annealing process includes using plasma, laser, rapid thermal processing (RTP) or furnace, for example. Furthermore, the operating temperature for the lightly doped drain annealing process is, for example, between 500° C. to 900° C.

According to the method of fabricating a MOS transistor in one embodiment of the present invention, the source/drain annealing process includes performing a mini-second annealing process. The mini-second annealing process includes using plasma, laser or rapid thermal processing (RTP), for example.

According to the method of fabricating a MOS transistor in one embodiment of the present invention, after forming the second lightly doped drain regions, and before forming the first and the second spacers, further includes performing an annealing process.

According to the method of fabricating a MOS transistor in one embodiment of the present invention, the first gate structure is the gate structure of an input/output transistor and the second gate structure is the gate structure of a core transistor.

This present invention also provides a method of fabricating a complementary metal-oxide-semiconductor (CMOS) transistor. The method includes providing a substrate having an isolation structure already formed therein. The isolation structure defines a first active region and a second active region. Then, a first gate structure and a second gate structure are formed on the substrate in the first and the second active regions respectively. The first gate structure has a dimension greater than the second gate structure. After that, first lightly doped drain regions are formed in the substrate on two sides of the first gate structure within the first active region. A first lightly doped drain annealing process is performed. Thereafter, second lightly doped drain regions, third lightly doped drain regions and fourth lightly doped drain regions are formed in the substrate on two sides of the second gate structure in the first active region, the first gate structure in the second active region and the second gate structure in the second active region respectively. Next, first spacers are formed on the sidewalls of the first and second gate structures in the first active region and second spacers are formed on the sidewalls of the first and the second gate structures in the second active region simultaneously. Then, first source/drain regions are formed in the substrate on two sides of the first spacers and second source/drain regions are formed in the substrate on two sides of the second spacers. Afterwards, a source/drain annealing process is performed.

According to the method of fabricating a CMOS transistor in one embodiment of the present invention, the first lightly doped drain annealing process includes using plasma, laser, rapid thermal processing (RTP) or furnace, for example.

According to the method of fabricating a CMOS transistor in one embodiment of the present invention, the operating temperature for the first lightly doped drain annealing process is, for example, between 500° C. to 900° C.

According to the method of fabricating a CMOS transistor in one embodiment of the present invention, the method of the source/drain annealing process includes performing a mini-second annealing process. The mini-second annealing process includes using plasma, laser or rapid thermal processing (RTP), for example.

According to the method of fabricating a CMOS transistor in one embodiment of the present invention, the method of forming the second, the third and the fourth lightly doped drain regions includes the following steps, for example. First, the third lightly doped drain regions are formed in the substrate on two sides of the first gate structure in the second active region. Then, the second lightly doped drain regions are formed in the substrate on two sides of the second gate structure in the first active region. Afterwards, the fourth lightly doped drain regions are formed in the substrate on two sides of the second gate structure in the second active region. In one embodiment, after forming the third lightly doped drain regions, and before forming the second and the fourth lightly doped drain regions, further includes performing a second lightly doped drain annealing process.

According to the method of fabricating a CMOS transistor in one embodiment of the present invention, the second lightly doped drain annealing process includes using plasma, laser, rapid thermal processing (RTP) or furnace, for example. Furthermore, the operating temperature for the second lightly doped drain annealing process is, for example, between 500° C. to 900° C.

According to the method of fabricating a CMOS transistor in one embodiment of the present invention, after forming the second, the third and the fourth lightly doped drain regions, and before forming the first and the second spacers, further includes performing an annealing process.

According to the method of fabricating a CMOS transistor in one embodiment of the present invention, the first gate structure is the gate structure of an input/output transistor and the second gate structure is the gate structure of a core transistor.

According to the method of fabricating a CMOS transistor in one embodiment of the present invention, the first active region is an N-type active region and the second active region is a P-type active region.

This present invention also provides another method of fabricating a complementary metal-oxide-semiconductor (CMOS) transistor. The method includes providing a substrate having an isolation structure already formed therein. The isolation structure defines a first active region and a second active region. Then, a first gate structure and a second gate structure are formed on the substrate in the first and the second active regions respectively. The first gate structure has a dimension greater than the second gate structure. After that, first lightly doped drain regions are formed in the substrate on two sides of the first gate structure in the first active region and second lightly doped drain regions are formed in the substrate on two sides of the first gate structure in the second active region. Then, a lightly doped drain annealing process is performed. Next, third lightly doped drain regions are formed in the substrate on two sides of the second gate structure in the first active region and fourth lightly doped drain regions are formed in the substrate on two sides of the second gate structure in the second active region. Subsequently, first spacers are formed on the sidewalls of the first and the second gate structures within the first active region and second spacers are formed on the sidewalls of the first and the second gate structures within the second active region simultaneously. Then, first source/drain regions are formed in the substrate on two sides of the first spacers and second source/drain regions are formed in the substrate on two sides of the second spacers. Afterwards, a source/drain annealing process is performed.

According to the method of fabricating a CMOS transistor in one embodiment of the present invention, the lightly doped drain annealing process includes using, for example, plasma, laser, rapid thermal processing (RTP) or furnace. Furthermore, the operating temperature for the second lightly doped drain annealing process is, for example, between 500° C. to 900° C.

According to the method of fabricating a CMOS transistor in one embodiment of the present invention, the source/drain annealing process includes performing a mini-second annealing process. The mini-second annealing process includes using plasma, laser or rapid thermal processing (RTP), for example.

According to the method of fabricating a CMOS transistor in one embodiment of the present invention, after forming the third and the fourth lightly doped drain regions, and before forming the first and the second spacers, further includes performing an annealing process.

According to the method of fabricating a CMOS transistor in one embodiment of the present invention, the first gate structure is the gate structure of an input/output transistor and the second gate structure is the gate structure of a core transistor.

According to the method of fabricating a CMOS transistor in one embodiment of the present invention, the first active region is an N-type active region and the second active region is a P-type active region.

In the present invention, the process of fabricating the lightly doped drain structure of larger devices is carried out first, then the lightly doped drain regions are annealed and finally the process of fabricating the lightly doped drain structure of smaller devices is carried out. Thus, too much lateral diffusion in smaller devices leading to short channel effect or punch through problems and too little lateral diffusion in larger devices leading to a high impedance in the overlapping region between the lightly doped drain region and the gate, thereby lowering the saturation and drain current and affecting device performance, can be avoided. In addition, the source/drain annealing process includes a mini-second annealing process so that the temperature rise and fall within a very short time interval. Therefore, excessive diffusion within the doped regions (including the source/drain regions and the lightly doped drain regions) is prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
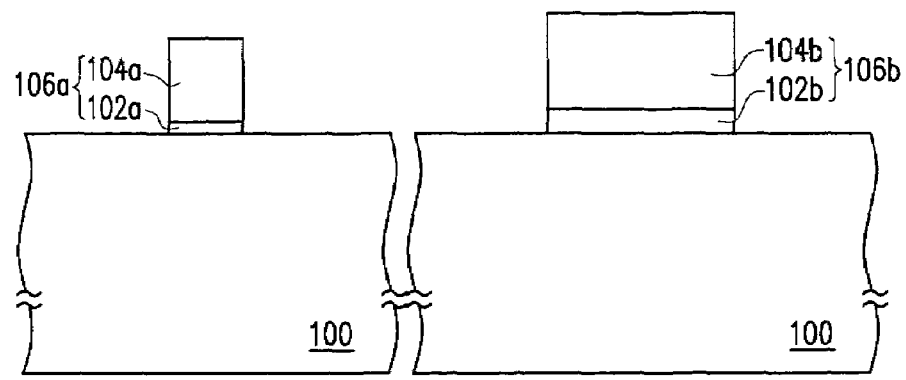
FIGS. 1A through 1F are schematic cross-sectional views showing the steps for fabricating a metal-oxide-semiconductor (MOS) transistor according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are schematic cross-sectional views showing the steps for fabricating a metal-oxide-semiconductor (MOS) transistor according to one embodiment of the present invention. In the present embodiment, an N-type transistor is used as an example. However, the applications of the present invention are not limited as such. In practice, the present invention can be applied to a P-type transistor after some adjustments and modifications.

As shown in FIG. 1A, a substrate 100 is provided. The substrate 100 can be a conventional silicon substrate or an SOI (silicon on insulator) type substrate. Then, gate dielectric layers 102a and 102b are formed on the substrate 100. The material for the gate dielectric layers 102a and 102b is silicon oxide and formed, for example, by performing a thermal oxidation process. After that, gates 104a and 104b are formed on the substrate 100. The material constituting the gates 104a and 104b is, for example, doped polysilicon.

The foregoing gate dielectric layer 102a and the gate 104a together form a gate structure 106a and the foregoing gate dielectric layer 102b and the gate 104b form another gate structure 106b. Furthermore, the gate structure 106b has a dimension greater than the gate structure 106a. In other words, both the line width and the thickness of the gate dielectric layer of the gate structure 106b are greater than that of the gate structure 106a. The gate structure 106b is the gate structure of an input/output (I/O) transistor and the gate structure 106a is the gate structure of a core transistor, for example. In the 65 nm process, thickness of the gate dielectric layer of the input/output transistor is about 52 nm and thickness of the gate dielectric layer of the core transistor is about 12 nm.

Figure 1B:
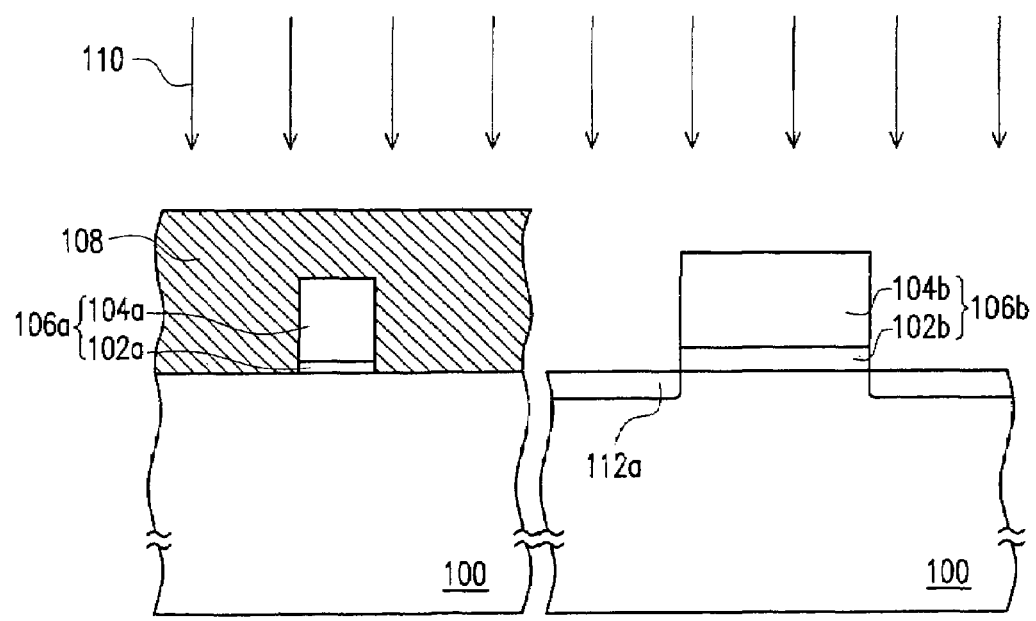

As shown in FIG. 1B, a photoresist layer 108 is formed to cover the gate structure 106a. Then, using the photoresist layer 108 and the gate structure 106b as a mask, an ion implant process 110 is performed to implant N-type ions to form N-type lightly doped drain (LDD) regions 112a in the substrate 100 on two sides of the gate structure 106b.

Figure 1C:
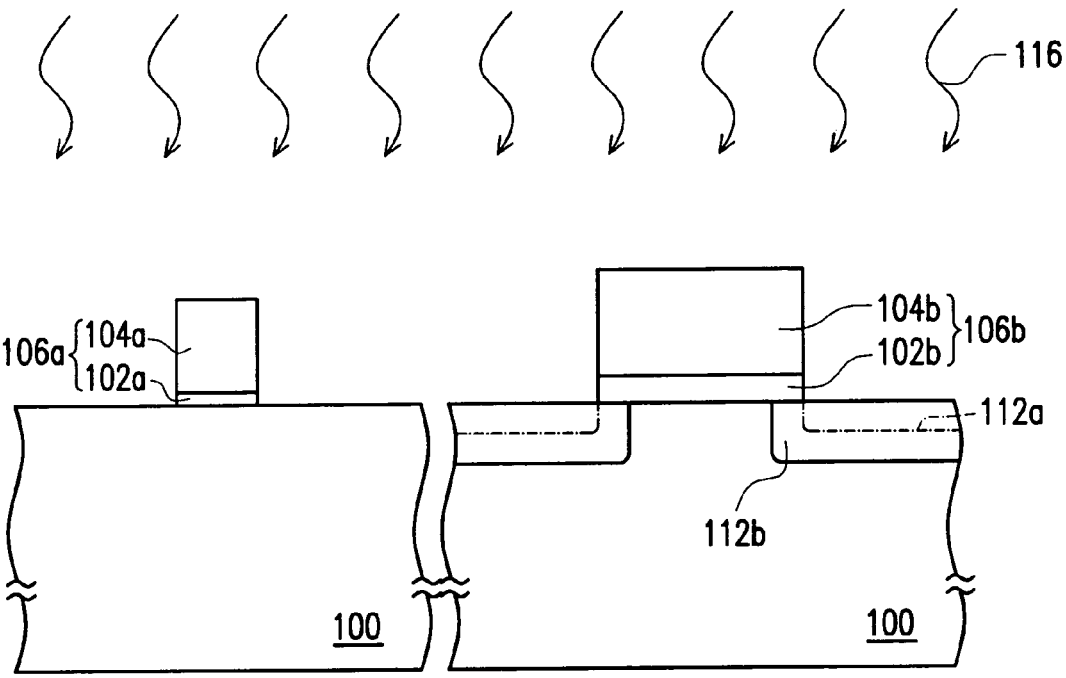

As shown in FIG. 1C, the photoresist layer 108 is removed. Next, a lightly doped drain annealing process 116 is performed. The method of the lightly doped drain annealing process 116 includes using plasma, laser, rapid thermal processing (RTP) or furnace, for example. The lightly doped drain annealing process 116 is performed at an operating temperature, for example, between 500° C. to 900° C.

The foregoing lightly doped drain annealing process 116, beside repairing damages to the surface of the substrate 100 resulting from the bombardment of ions in the ion implant process 110, also thermally diffuses the ions implanted into the lightly doped drain regions 112a, both vertically and horizontally, to form the lightly doped drain regions 112b.

Figure 1D:
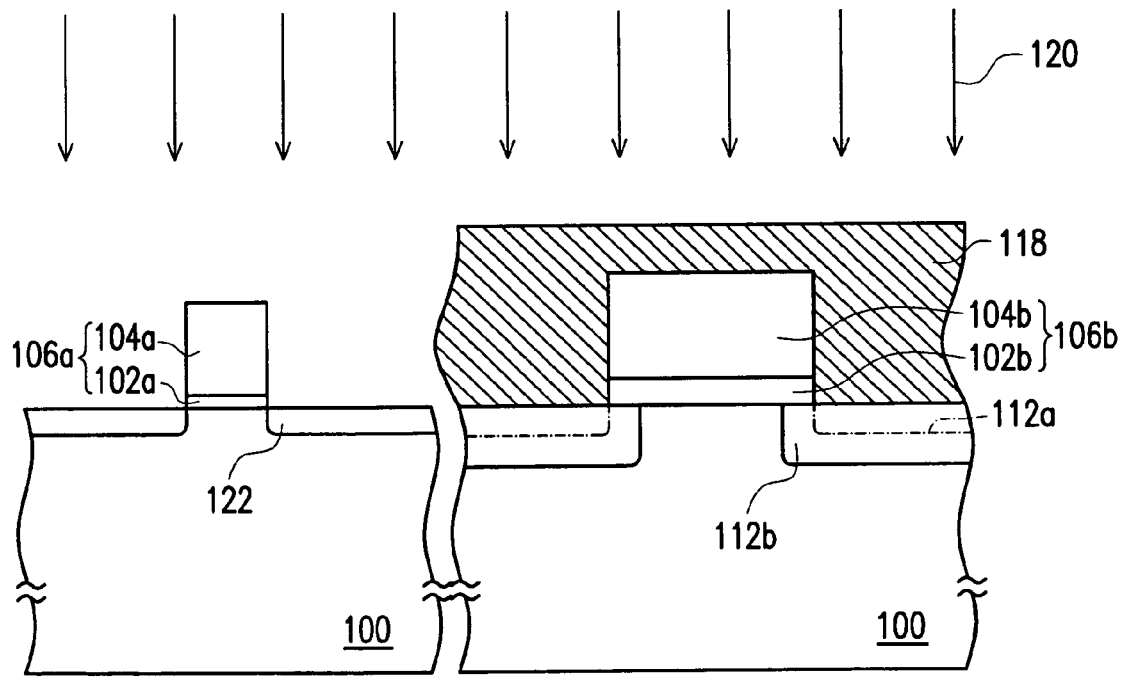

As shown in FIG. 1D, a photoresist layer 118 is formed to cover the gate structure 106b. Then, using the gate structure 106a and the photoresist layer 118 as a mask, an ion implant process 120 is performed to implant N-type ions and form an N-type lightly doped drain region 122 in the substrate 100 on two sides of the gate structure 106a.

Obviously, in one embodiment, after forming the lightly doped drain region 122, the photoresist layer 118 is removed. Then, an annealing process (not indicated in the figure) is performed to repair damages to the surface of the substrate 100 due to the bombardment with ions. Similarly, the annealing process also initiates thermal diffusion of the implanted ions and expands the doped area (not shown) of the lightly doped drain regions 122. In addition, compared with the annealing process 116 for annealing the lightly doped drain regions of larger size gate structure 106a, the foregoing annealing processes only targets smaller size gate structure 106a and hence will not lead to an over-diffusion of the ions in the lightly doped drain regions 112b.

Figure 1E:
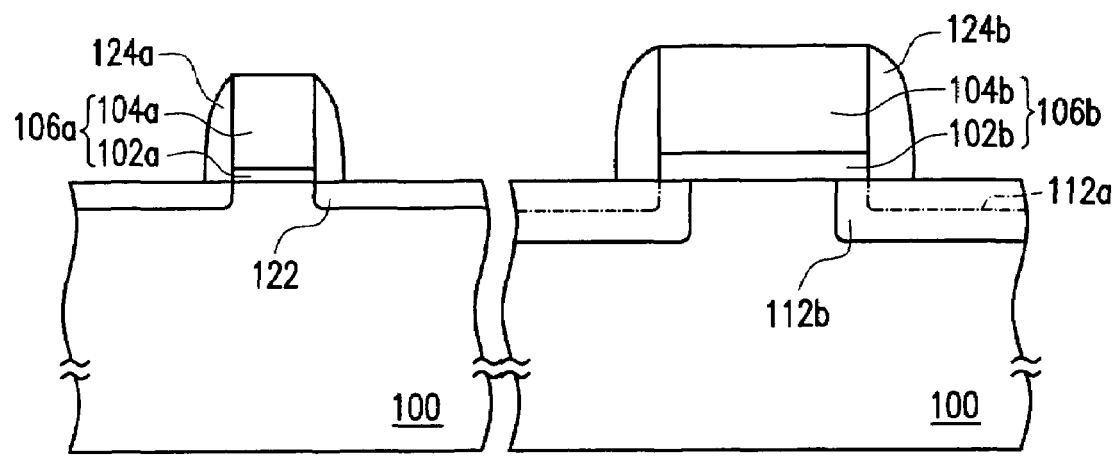

As shown in FIG. 1E, the photoresist layer 118 is removed. After that, spacers 124a and 124b are simultaneously formed on the sidewalls of the gate structures 106a and 106b respectively. The method of forming the spacers 124a and 124b includes, forming a spacer material layer (not shown) over the substrate 100. The material constituting the spacer material layer includes, for example, silicon nitride, silicon oxide or a suitable dielectric material. Next, an anisotropic etching process is performed to remove redundant spacer material to form the spacers.

Figure 1F:
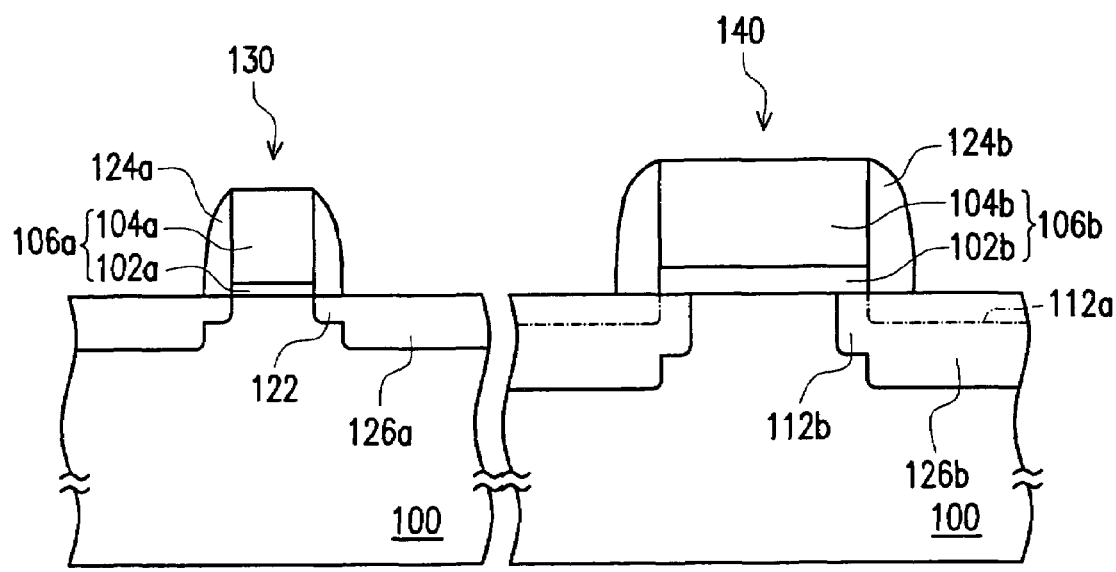

As shown in FIG. 1F, N-type source/drain regions 126a are formed in the substrate 100 on two sides of the spacers 124a and another N-type source/drain regions 126b are formed in the substrate on two sides of the spacers 124b, thereby forming a core transistor 130 and an input/output (I/O) transistor 140 respectively. The method of forming the source/drain regions 126a and the 126b includes, for example, performing an ion implant process.

Afterwards, a source/drain annealing process is performed (not indicated in the figure) so that the crystal lattice in the source/drain regions 126a and 126b damaged by the implanted ions are repaired. The source/drain annealing process comprises a mini-second annealing process, for example. The mini-second annealing process is an annealing process that involves raising and lowering the temperature rapidly within a thousandth of a second using plasma, laser or rapid thermal processing, for example. Since the temperature in the foregoing source/drain annealing process rises and falls within a very short time, damages to the surface of the substrate due to ion bombardment can be repaired without causing over diffusion in the doped regions (including the source/drain regions 126a, 126b and the lightly doped drain regions 112b, 122).

In the foregoing embodiment of the present invention, the process of fabricating the lightly doped drain structure of larger devices (input/output transistors) is carried out first, then the lightly doped drain regions are annealed and finally the process of fabricating the lightly doped drain structure of smaller devices (core transistors) is carried out. Thus, too much lateral diffusion in smaller devices leading to short channel effect or punch through problems and too little lateral diffusion in larger devices leading to a high impedance in the overlapping region between the lightly doped drain region and the gate, thereby lowering the saturation and drain current and affecting device performance, can be avoided.

In the following, a few embodiments are provided to illustrate the method of fabricating a complementary metal-oxide-semiconductor (CMOS) transistor.

FIGS. 2A through 2F are schematic cross-sectional views showing the steps for fabricating a complementary metal-oxide-semiconductor (CMOS) transistor according to one embodiment of the present invention.

Figure 2A:
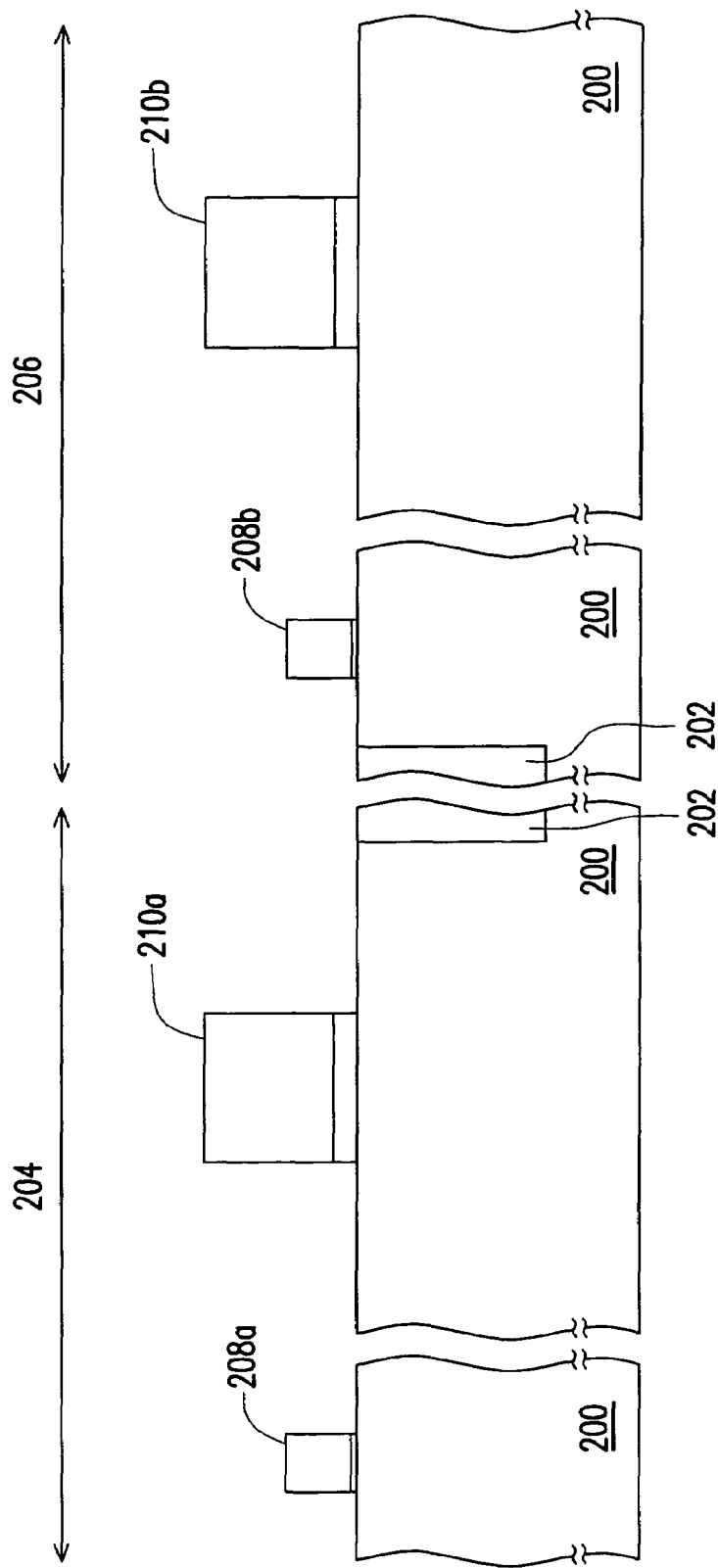
FIGS. 2A through 2F are schematic cross-sectional views showing the steps for fabricating a complementary metal-oxide-semiconductor (CMOS) transistor according to one embodiment of the present invention.

As shown in FIG. 2A, a substrate 200 is provided. The substrate 200 can be a conventional silicon substrate or an SOI (silicon on insulator) type substrate. Furthermore, the substrate 200 has an isolation structure such as a shallow trench isolation (STI) structure 202 already formed therein. The isolation structure 202 defines two active regions, a first active region and a second active region. In the present embodiment, the first active region is an N-type active region 204 and the second active region is a P-type active region 206, for example.

Again, as shown in FIG. 2A, a first gate structure 208a and a second gate structure 210a are formed on the substrate 200 in the N-type active region 204 and a third gate structure 208b and a fourth gate structure 210b are formed on the substrate 200 in the P-type active region 206. Each of the gate structures 208a, 208b, 210a and 210b comprises a gate dielectric layer and a gate. The gate dielectric layer is a silicon oxide layer and formed by performing a thermal oxidation, and the gate is a doped polysilicon layer, for example.

The gate structures 210a and 210b have a dimension greater than the gate structures 208a and 208b. In other words, both the line width and thickness of the gate dielectric layer of the gate structures 210a and 210b are greater than that of the gate structures 208a and 208b. The gate structures 210a and 210b can be the gate structures of an input/output (I/O) transistor and the gate structures 208a and 208b can be the gate structures of a core transistor, for example. In the 65 nm process, thickness of the gate dielectric layer of an input/output transistor is about 52 nm and thickness of the gate dielectric layer of a core transistor is about 12 nm.

Figure 2B:
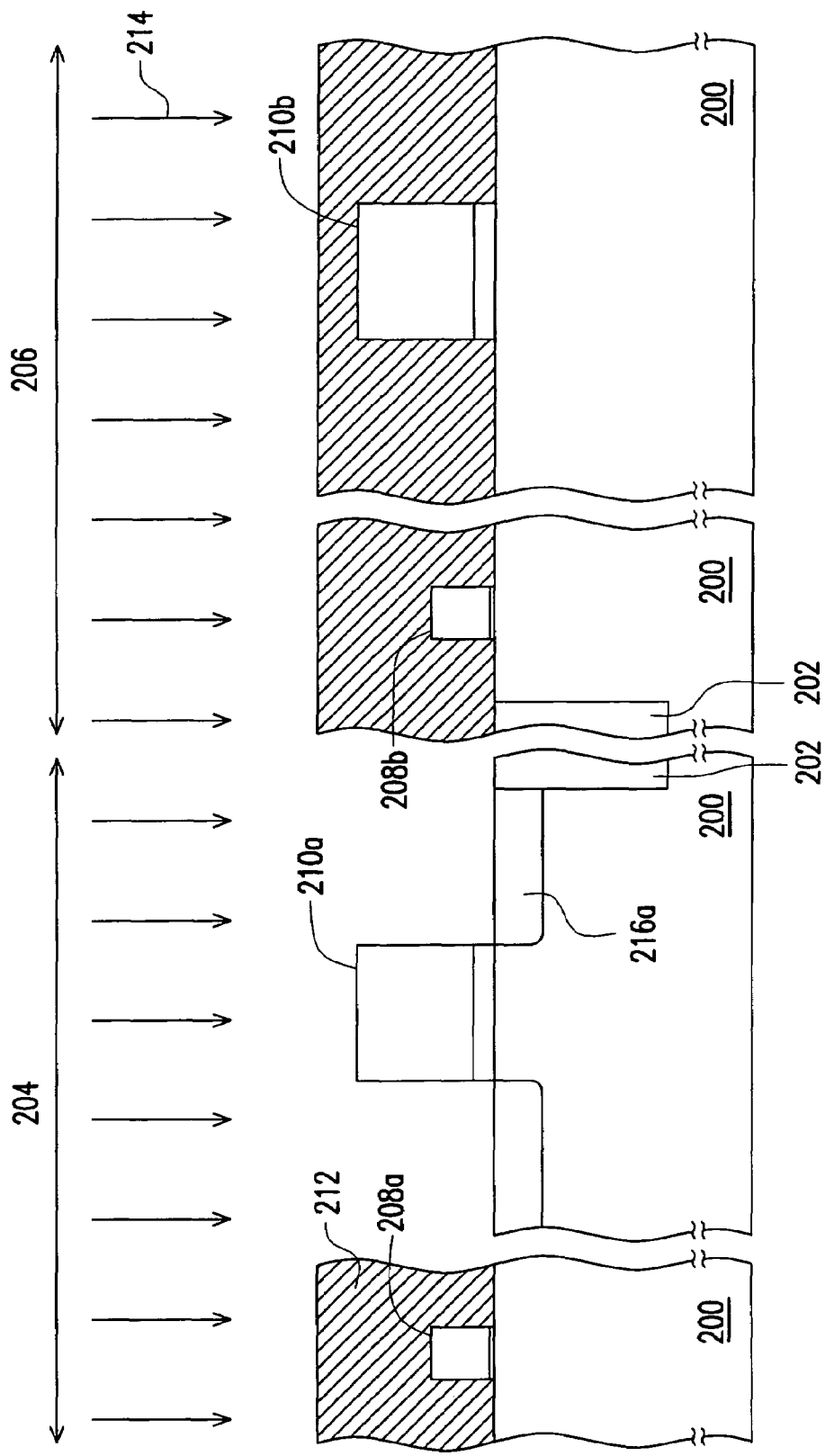

As shown in FIG. 2B, a photoresist layer 212 is formed to cover the gate structures 208a, 208b and 210b. Then, using the photoresist layer 212 and the gate structure 210a as a mask, an ion implant process 214 is performed to implant N-type ions to form a lightly doped drain region 216a in the substrate 200 on two sides of the gate structure 210a in the N-type active region 204.

Figure 2C:
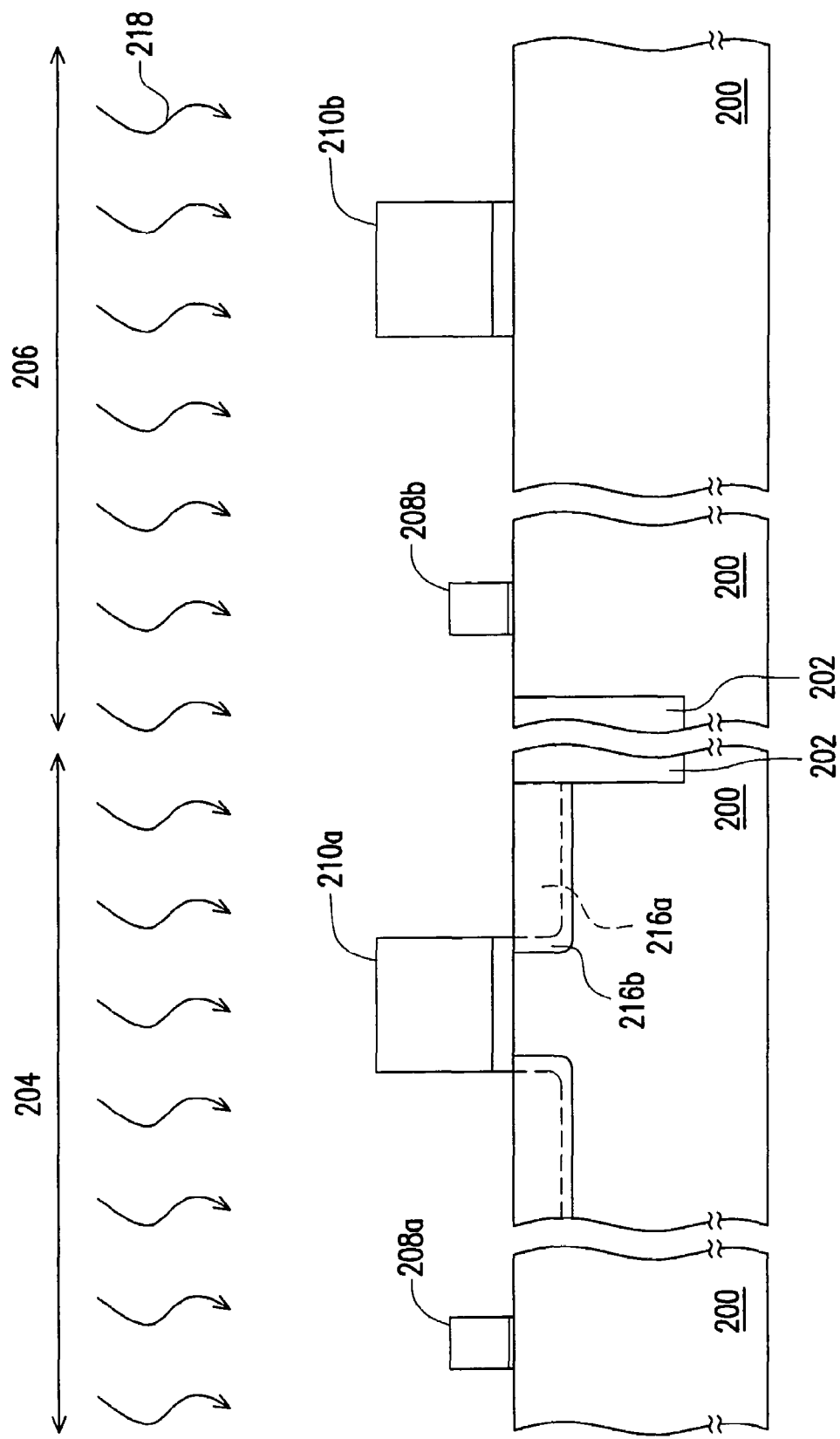

As shown in FIG. 2C, the photoresist layer 212 is removed. Then, an lightly doped drain annealing process 218 is performed. The method of the lightly doped drain annealing process 218 includes using plasma, laser, rapid thermal processing or furnace, for example. The operating temperature of the lightly doped drain annealing process 218 is, for example, between 500° C. to 900° C.

The foregoing lightly doped drain annealing process 218, beside repairing the surface of the substrate 200 due to the bombarding ions after the ion implant process 214, also initiates thermal diffusion of the ions implanted into the lightly doped drain regions 216a, both vertically and horizontally, to form the N-type lightly doped drain regions 216b.

Figure 2D:
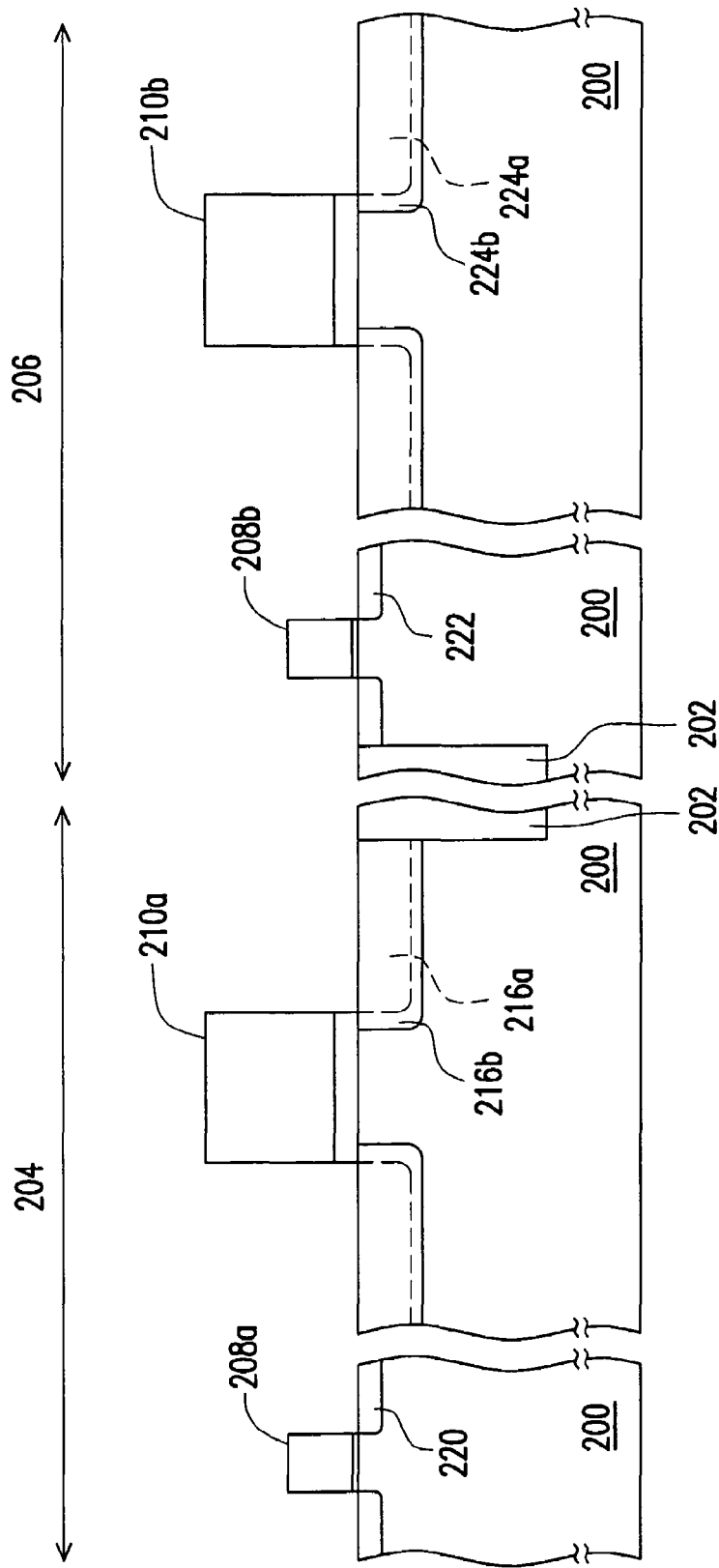

As shown in FIG. 2D, an N-type lightly doped drain region 220 is formed in the substrate 200 on two sides of the gate structure 208a in the N-type active region 204 and P-type lightly doped drain regions 222 and 224a are formed in the substrate 200 on two sides of the gate structures 208b and 210b in the P-type active region 206 respectively.

In one embodiment, the method of forming the lightly doped drain regions 220, 222 and 224a includes, for example, forming a photoresist layer (not shown) over the substrate 200 to cover the gate structures 208a, 208b and 210a. Then, using the photoresist layer and the gate structure 210b as a mask, an ion implant process (not indicated in the figure) is performed to implant P-type ions and form the lightly doped drain region 224a. Afterwards, a similar method is used to form the lightly doped drain regions 220 and 222 in sequence. In another embodiment, after forming the aforementioned lightly doped drain region 224a, and before forming the lightly doped drain regions 220 and 222, further includes performing a lightly doped drain annealing process (not indicated in the figure). The lightly doped drain annealing process is performed using plasma, laser, rapid thermal processing or furnace at an operating temperature between 500° C. to 900° C., for example. Similarly, the lightly doped drain annealing process, beside repairing the surface of the substrate 200 due to the bombarding ions after the ion implant process 214, also initiates thermal diffusion of the ions implanted into the lightly doped drain regions 224a to form the lightly doped drain regions 224b.

In another embodiment, after forming the lightly doped drain regions 220, 222 and 224, further includes performing an annealing process (not indicated in the figure) to repair the surface of the substrate 200 damaged by bombarding ions. The annealing process will similarly initiate thermal diffusion of the implanted ions and expand the doped area of the lightly doped drain regions 220 and 222. In compared with the annealing process 218 for annealing the lightly doped drain regions of larger size gate structure 210a, the foregoing annealing processes only targets smaller size gate structures 208a and 208b. Hence, it will not lead to an over-diffusion of the ions in the lightly doped drain regions 216b and 224b.

Figure 2E:
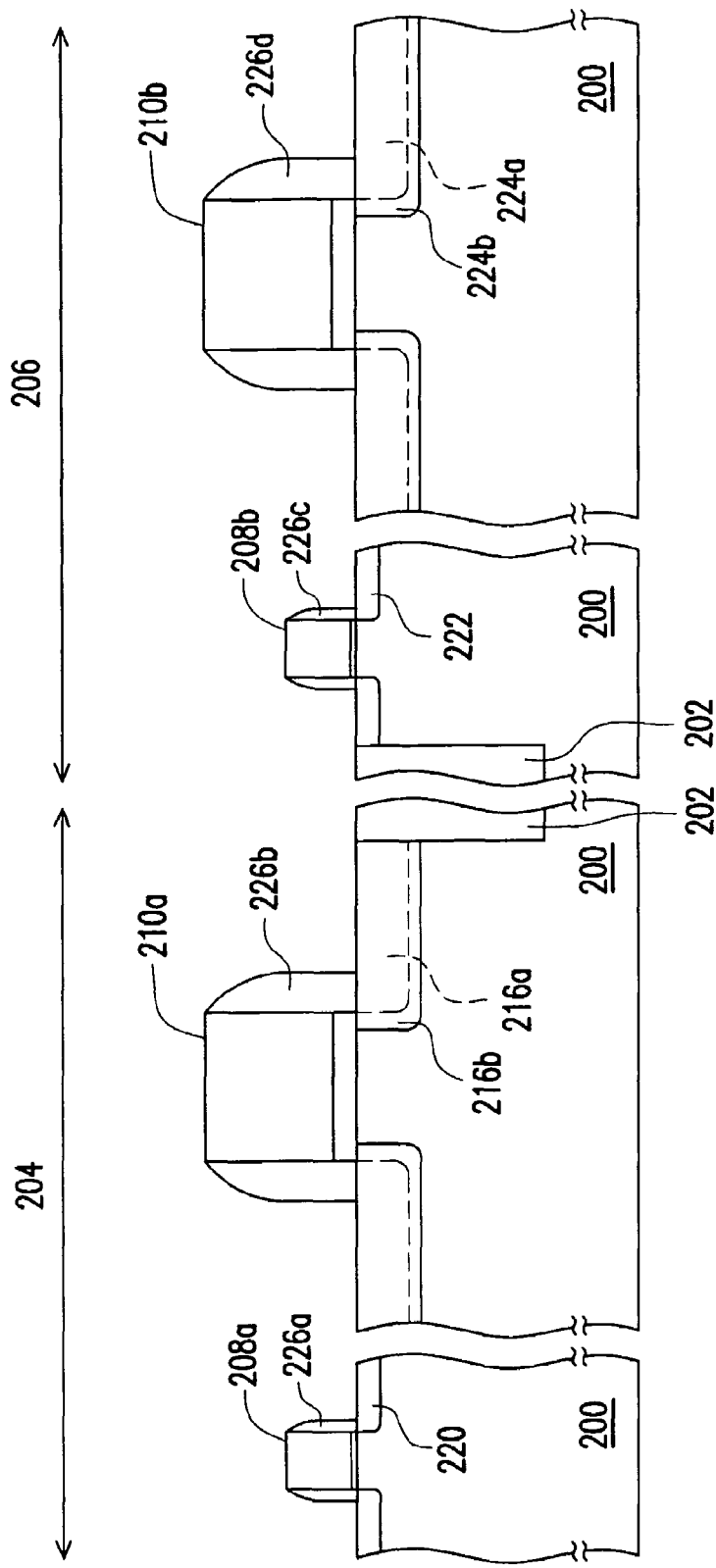

As shown in FIG. 2E, spacers 226a, 226b, 226c and 226c are formed on the sidewalls of the gate structures 208a, 210a, 208b and 210b respectively. The material constituting the spacers 226a, 226b, 226c and 226d includes, for example, silicon nitride, silicon oxide or suitable dielectric material.

Figure 2F:
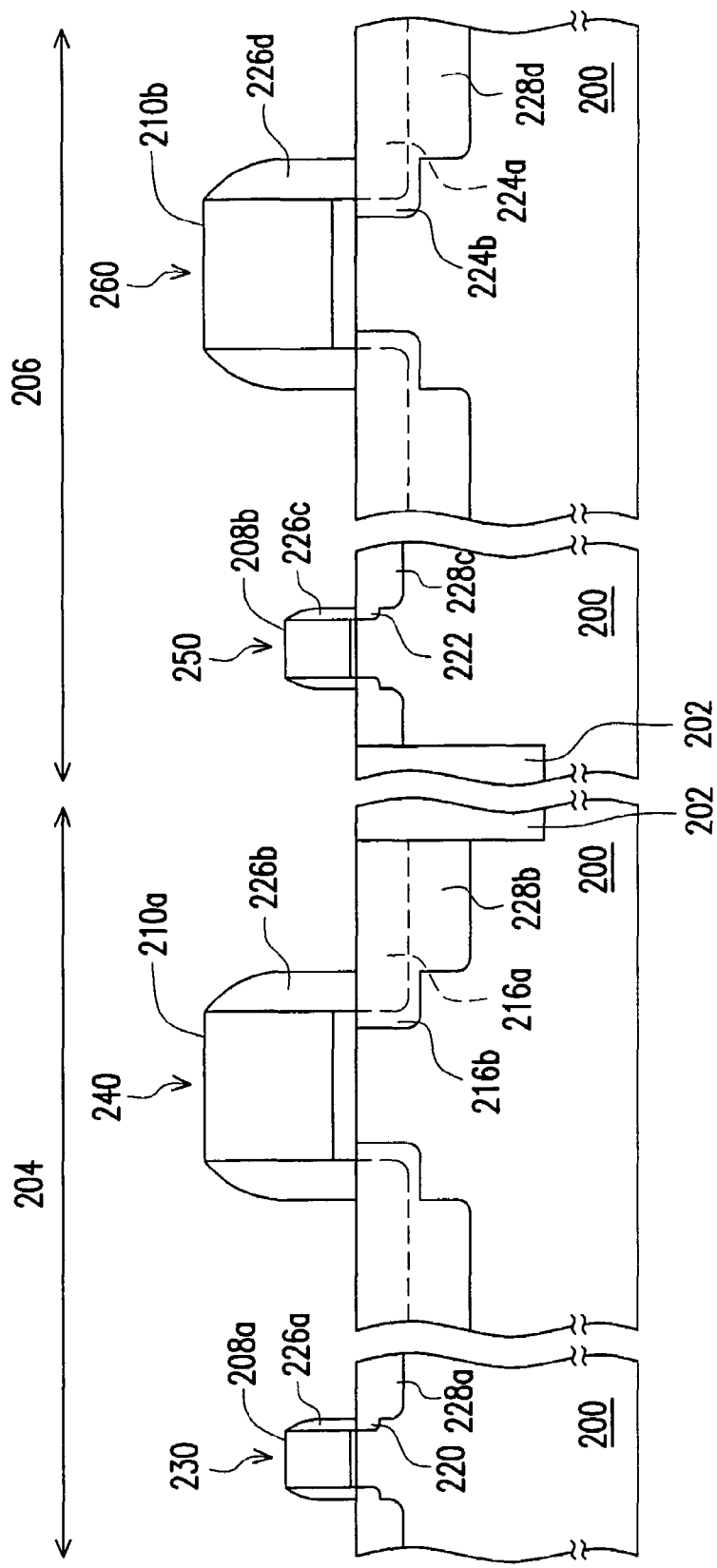

As shown in FIG. 2F, in the N-type active region 204, N-type source/drain regions 228a are formed in the substrate 200 on two sides of the spacers 226a and N-type source/drains 228b are formed in the substrate 200 on two sides of the spacers 226b, thereby forming a core transistor 230 and an input/output transistor 240 respectively. Furthermore, in the P-type active region 206, P-type source/drain regions 228c are formed in the substrate 200 on two sides of the spacers 226c and N-type source/drains 228d are formed in the substrate 200 on two sides of the spacers 226d, thereby forming a core transistor 250 and an input/output transistor 260 respectively. The method of forming the source/drain regions 228a, 228b, 228c and 228d includes, for example, performing an ion implant process.

Next, a source/drain annealing process (not indicated in the figure) is performed to repair the crystal lattice damaged by the implant ions in the source/drain regions 228a, 228b, 228c and 228d. The source/drain annealing process includes, for example, performing a mini-second annealing process using plasma, laser or rapid thermal processing. Since the temperature in the foregoing annealing process for annealing the source/drain regions rises and falls within a very short time, damages to the surface of the substrate due to ion bombardment can be repaired without causing over diffusion in the doped regions (including the source/drain regions and the lightly doped drain regions).

FIGS. 3A through 3F are schematic cross-sectional views showing the steps for fabricating a complementary metal-oxide-semiconductor (CMOS) transistor according to another embodiment of the present invention.

Figure 3A:
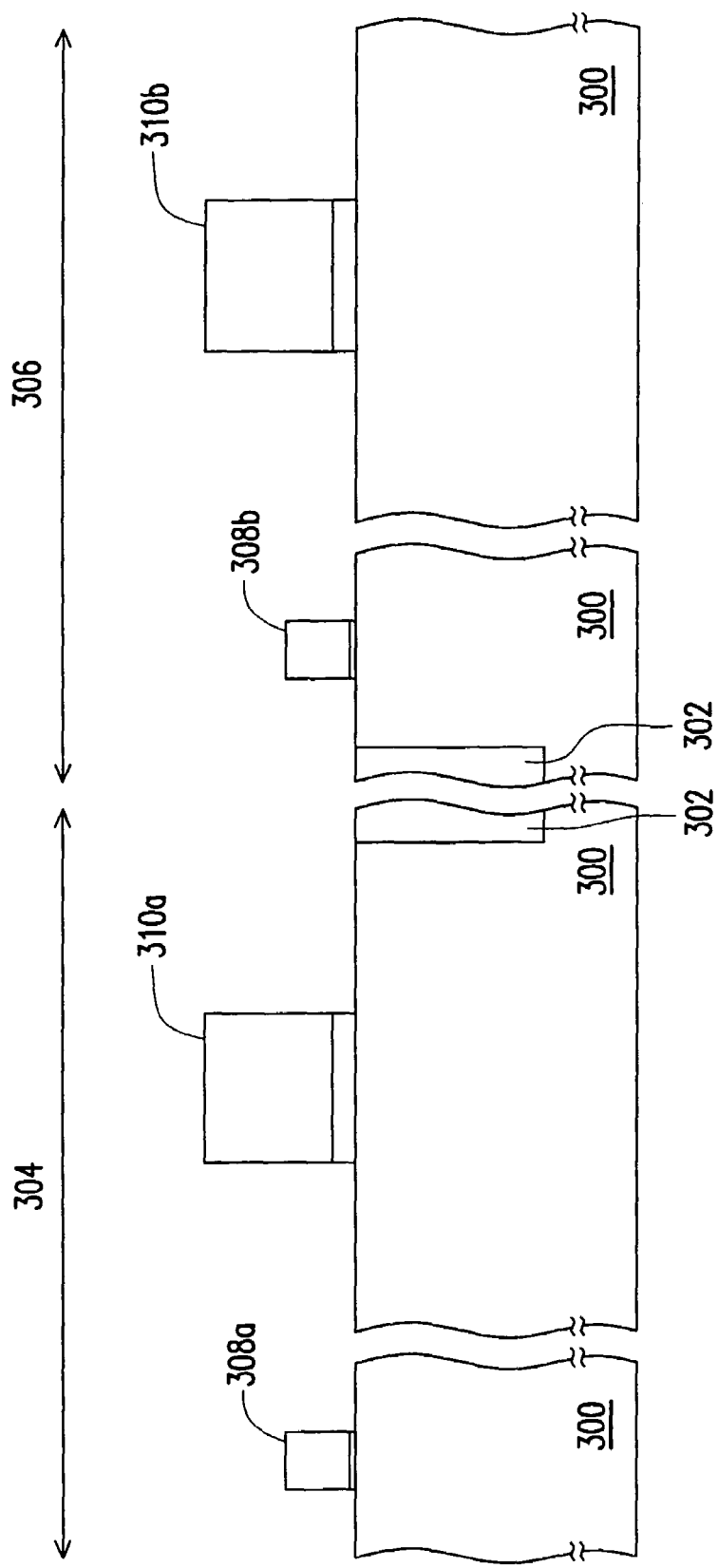
FIGS. 3A through 3F are schematic cross-sectional views showing the steps for fabricating a complementary metal-oxide-semiconductor (CMOS) transistor according to another embodiment of the present invention.

As shown in FIG. 3A, a substrate 300 is provided. The substrate 300 can be a conventional silicon substrate or an SOI (silicon on insulator) type substrate. Furthermore, the substrate 300 has an isolation structure such as a shallow trench isolation (STI) structure 302 already formed therein. The isolation structure 302 defines two active regions, a first active region and a second active region. In the present embodiment, the first active region is an N-type active region 304 and the second active region is a P-type active region 306, for example.

Again, as shown in FIG. 3A, a first gate structure 308a and a second gate structure 310a are formed on the substrate 300 in the N-type active region 304 and a third gate structure 308b and a fourth gate structure 310b are formed on the substrate 300 in the P-type active region 306. Each of the gate structures 308a, 308b, 310a and 310b comprises a gate dielectric layer and a gate. The material constituting the gate dielectric layer includes silicon oxide and is formed by performing a thermal oxidation method. The material constituting the gate includes doped polysilicon, for example.

The gate structures 310a and 310b have a dimension greater than the gate structures 308a and 308b. In other words, both the line width and thickness of the gate dielectric layer of the gate structures 310a and 310b are greater than that of the gate structures 308a and 308b. The gate structures 310a and 310b can be the gate structures of an input/output (I/O) transistor and the gate structures 308a and 308b can be the gate structures of a core transistor, for example. In the 65 nm process, thickness of the gate dielectric layer of an input/output transistor is about 52 nm and thickness of the gate dielectric layer of a core transistor is about 12 nm.

Figure 3B:
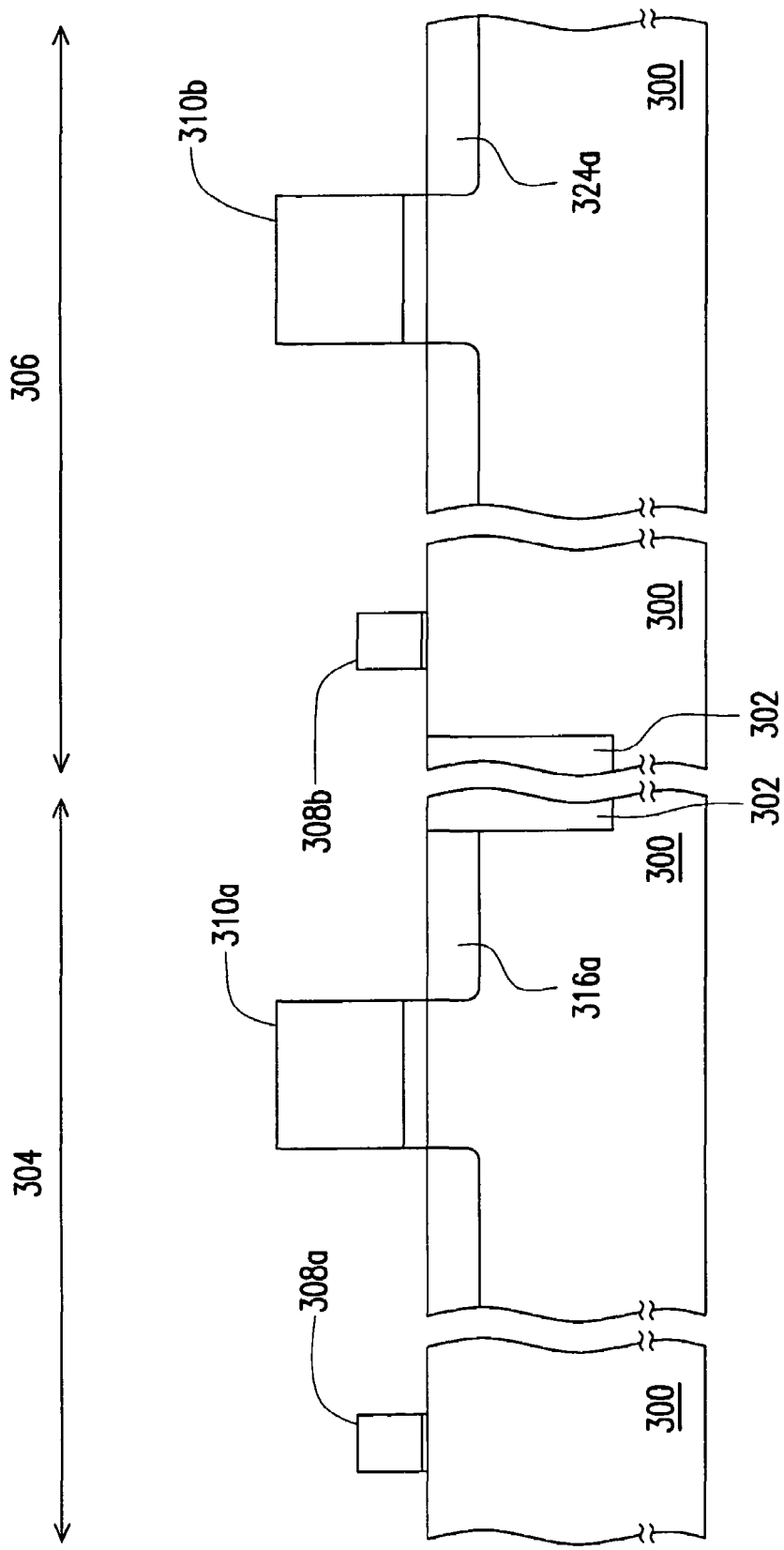

As shown in FIG. 3B, lightly doped drain regions 316a are formed in the substrate 300 on two sides of the gate structure 310a in the N-type active region 304 and lightly doped drain regions 324a are formed in the substrate 300 on two sides of the gate structure 310b in the P-type active region 306. The method of forming the lightly doped drain regions 316a and 324a includes, for example, forming a photoresist layer (not shown) to cover the gate structures 308a, 308b and 310b. Then, using the photoresist layer and the gate structures 208a, 208b and 310b as a mask, an ion implant process is performed to form lightly doped drain regions 316a. After that, a similar method is used to form lightly doped drain regions 324a.

Alternatively, the method of forming the lightly doped drain regions 316a and 324a includes, for example, forming a photoresist layer (not shown) over the substrate 300 to cover the gate structures 308a, 308b and 310b. Then, using the photoresist layer and the gate structures 308a, 308b and 310a as a mask, an ion implant process is performed to form the lightly doped drain regions 324a. Afterwards, the lightly doped drain regions 316a are formed similarly.

Figure 3C:
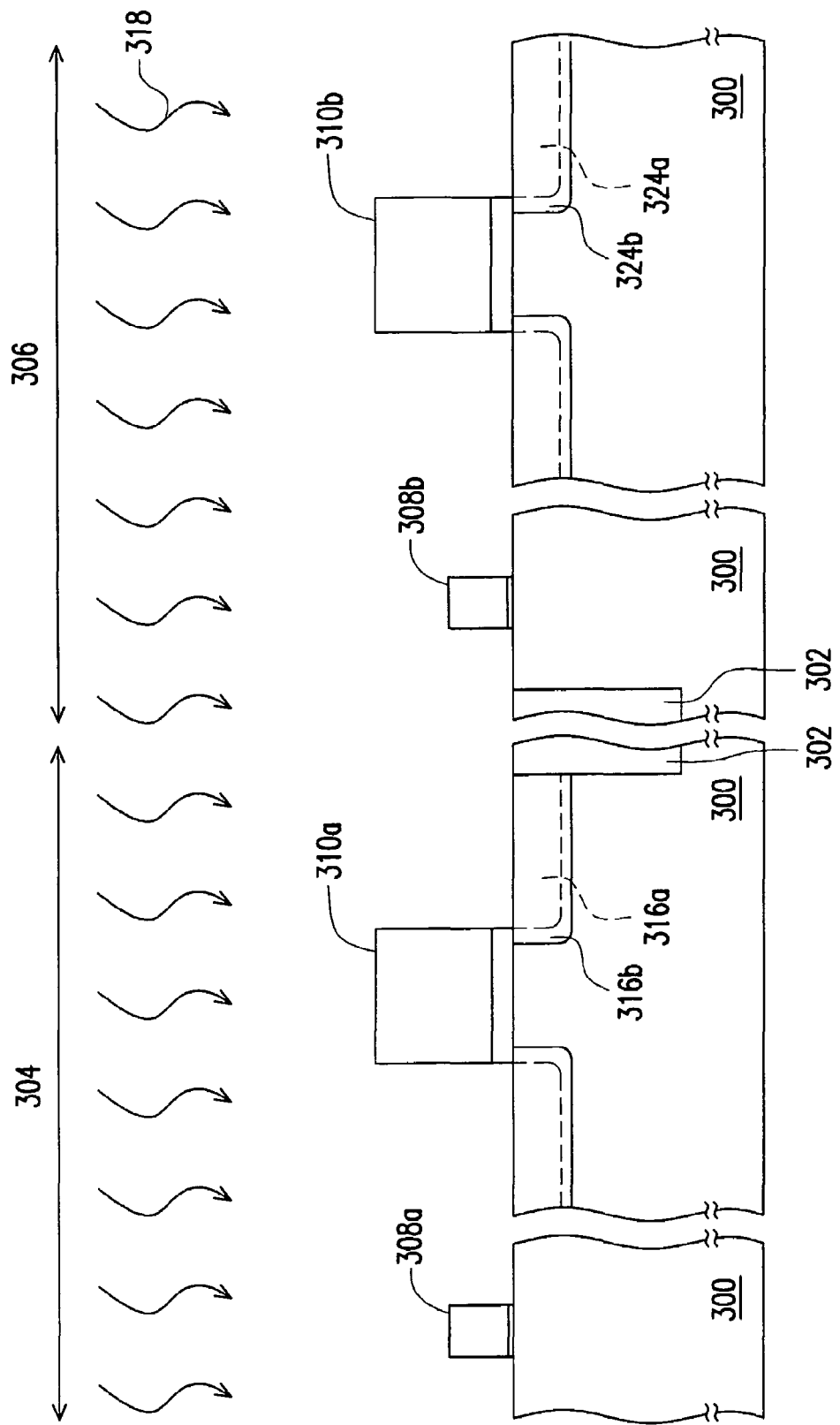

As shown in FIG. 3C, a lightly doped drain annealing process 318 is performed. The lightly doped drain annealing process 318 includes using plasma, laser, rapid thermal processing or furnace, for example. The operating temperature for performing the lightly doped drain annealing process 318 is, for example, between 500° C. to 900° C. The lightly doped drain annealing process 318, beside repairing the surface of the substrate 300 due to the bombarding ions after the ion implant process, also initiates thermal diffusion of the ions implanted into the lightly doped drain regions 316a and 324a to form the N-type lightly doped drain regions 316b and 324b.

Figure 3D:
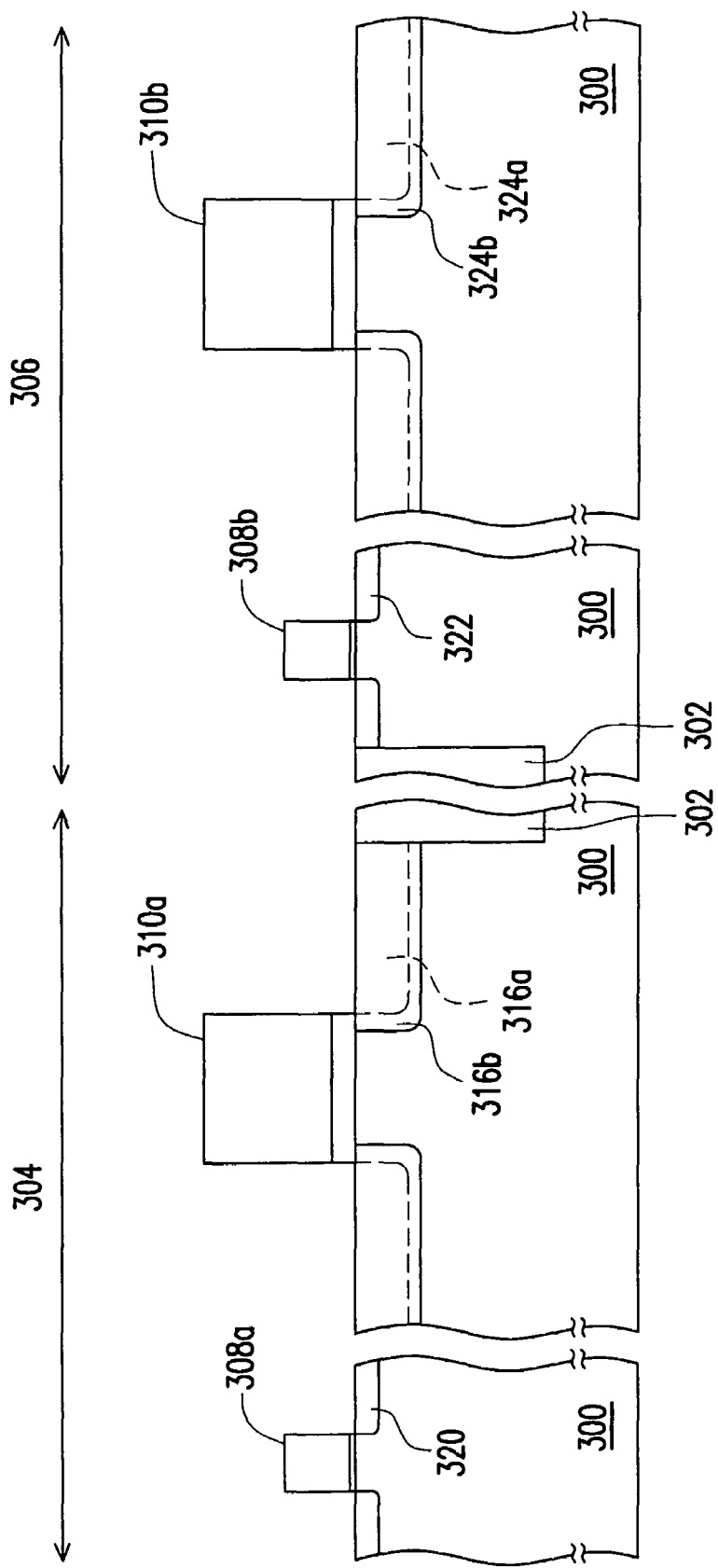

As shown in FIG. 3D, N-type lightly doped drain regions 320 are formed in the substrate 300 on two sides of the gate structure 308a in the N-type active region 304 and P-type lightly doped drain region 322 are formed in the substrate 300 on two sides of the gate structure 308b in the P-type active region 306.

In one embodiment, after forming the lightly doped drain regions 320 and 322, further includes performing an annealing process (not indicated in the figure) to repair the surface of the substrate 300 due to bombarding ions. The annealing process also initiates thermal diffusion of the implanted ions and leads to an expansion of the doped area (not shown) of the lightly doped drain regions 320 and 322. Relatively speaking, the annealing process 318 is used for annealing the lightly doped drain regions of larger size gate structures 310a and 310b while the foregoing annealing process is used for annealing the lightly doped drain regions of smaller size gate structures 308a and 308b. Therefore, the foregoing annealing process will not cause over diffusion of the lightly doped drain regions 316b and 324b.

Figure 3E:
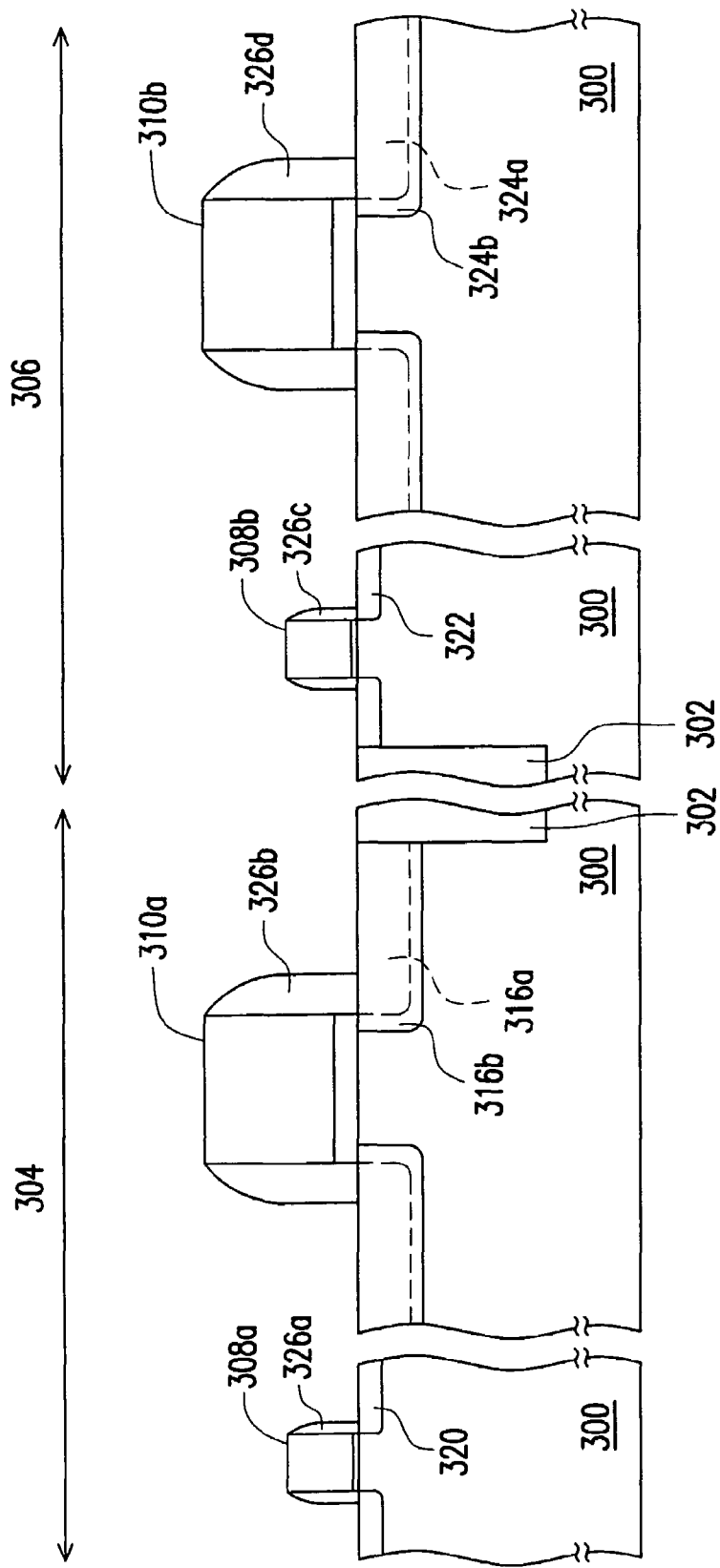

As shown in FIG. 3E, spacers 326a, 326b, 326c and 326d are formed on the sidewalls of the gate structures 308a, 310a, 308b and 310b respectively. The material constituting the spacers 326a, 326b, 326c and 326d includes, for example, silicon nitride, silicon oxide or suitable dielectric material.

Figure 3F:
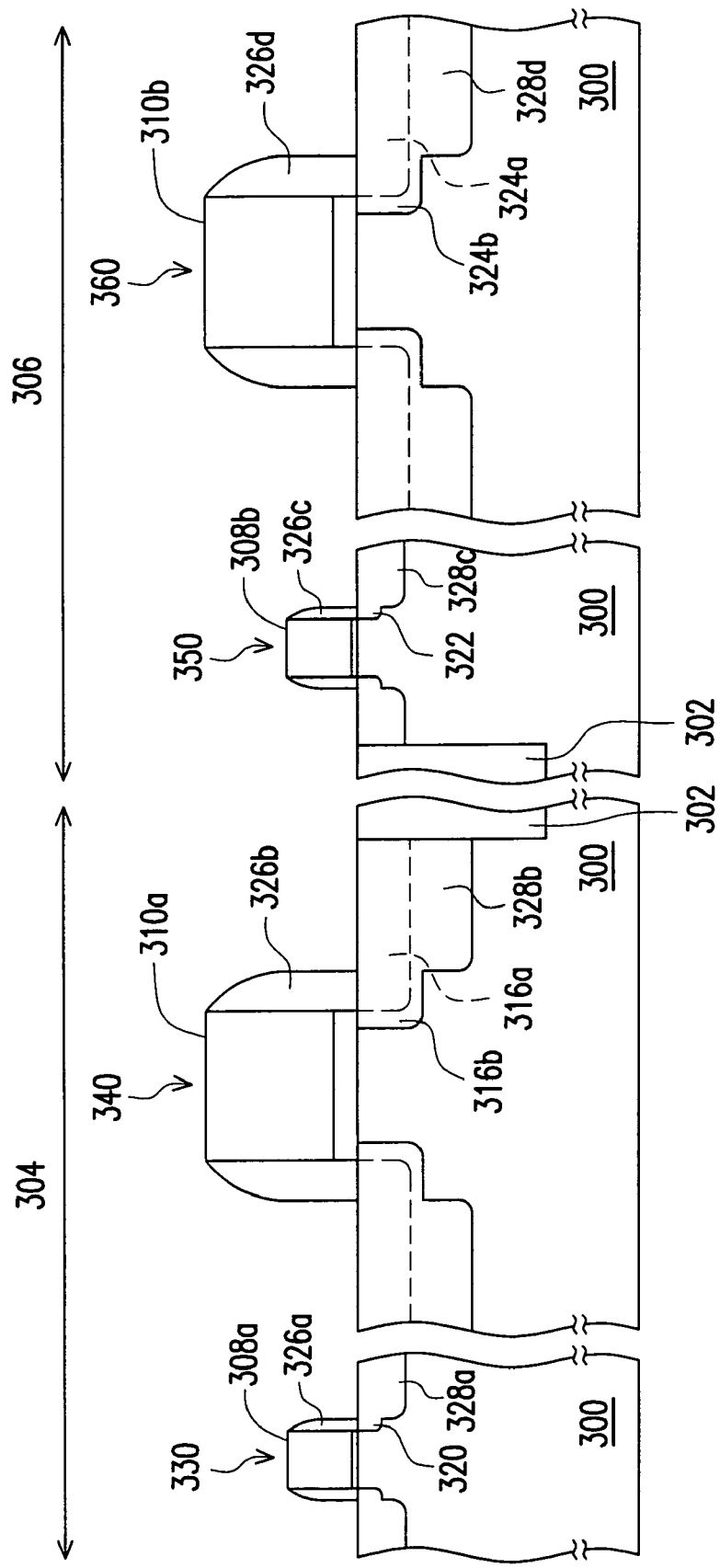

As shown in FIG. 3F, in the N-type active region 304, N-type source/drain regions 328a are formed in the substrate 300 on two sides of the spacers 326a and N-type source/drain regions 328b are formed in the substrate 300 on two sides of the spacers 326b, thereby forming a core transistor 330 and an input/output transistor 340 respectively. Furthermore, in the P-type active region 306, P-type source/drain regions 328c are formed in the substrate 300 on two sides of the spacers 326c and N-type source/drain regions 328d are formed in the substrate 300 on two sides of the spacers 326d, thereby forming a core transistor 350 and an input/output transistor 360 respectively. The method of forming the source/drain regions 328a, 328b, 328c and 328d includes, for example, performing an ion implant process.

Afterwards, a source/drain annealing process is performed (not indicated in the figure) so that the crystal lattice in the source/drain regions 328a, 328b, 328c and 328d damaged by the implanted ions is repaired. The source/drain annealing process is performing by a mini-second annealing process using plasma, laser or rapid thermal processing, for example. Since the temperature in the foregoing source/drain annealing process rises and falls within a very short time, damages to the surface of the substrate due to ion bombardment can be repaired without causing over diffusion in the doped regions (including the source/drain regions and the lightly doped drain regions).

In the foregoing second embodiment of the present invention, the process of fabricating the lightly doped drain structure of larger devices (input/output transistors) is carried out first, then the lightly doped drain regions are annealed and finally the process of fabricating the lightly doped drain structure of smaller devices (core transistors) is carried out. Thus, too much lateral diffusion in smaller devices leading to short channel effect or punch through problems and too little lateral diffusion in larger devices leading to a high impedance in the overlapping region between the lightly doped drain region and the gate, thereby lowering the saturation and drain current and affecting device performance, can be avoided.

In summary, the method in the present invention avoid the problem of producing too large or too small a diffusion region in the lightly doped drain structure of devices with different dimensions. Moreover, the source/drain annealing process is performing by a mini-second annealing process with a very short temperature rise and fall interval. Therefore, damages to the surface of substrate resulted from the bombardment of ions can be repaired without causing an over diffusion of the lightly doped regions (including the source/drain regions and the lightly doped drain regions).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a metal-oxide-semiconductor (MOS) transistor, comprising:
    forming a first gate structure and a second gate structure on a substrate, wherein the first gate structure has a dimension greater than the second gate structure;
    forming first N-type lightly doped drain regions in the substrate on two sides of the first gate structure;
    after forming the N-type first lightly doped drain regions, performing a lightly doped drain annealing process;
    after performing the lightly doped drain annealing process, forming a second N-type lightly doped drain region in the substrate on two sides of the second gate structure;
    forming first spacers on the sidewalls of the first gate structure and simultaneously forming second spacers on the sidewalls of the second gate structure;
    forming first N-type source/drain regions in the substrate on two sides of the first spacers and forming second N-type source/drain regions in the substrate on two sides of the second spacers; and
    performing a source/drain annealing process.

2. The method of fabricating the MOS transistor of claim 1, wherein the method of the lightly doped drain annealing process comprises using plasma, laser, rapid thermal processing (RTP) or furnace.

3. The method of fabricating the MOS transistor of claim 1, wherein the lightly doped drain annealing process is performed at an operating temperature between about 500° C. to 900° C.

4. The method of fabricating the MOS transistor of claim 1, wherein the source/drain annealing process comprises a mini-second annealing process.

5. The method of fabricating the MOS transistor of claim 4, wherein the mini-second annealing process comprises using plasma, laser or rapid thermal processing.

6. The method of fabricating the MOS transistor of claim 1, wherein, after forming the second the N-type lightly doped drain regions, and before forming the first and the second spacers, further comprises performing an annealing process.

7. The method of fabricating the MOS transistor of claim 1, wherein the first gate structure comprises a gate structure of an input/output transistor and the second gate structure comprises a gate structure of a core transistor.

8. A method of fabricating a complementary metal-oxide-semiconductor (CMOS) transistor, comprising:
    providing a substrate having an isolation structure already formed thereon, wherein the isolation structure defines a first active region and a second active region;
    forming a first gate structure and a second gate structure on the substrate in the first and the second active regions respectively, wherein the first gate structure has a greater dimension than the second gate structure;
    forming first lightly doped drain regions in the substrate on two sides of the first gate structure in the first active region;
    after forming the first lightly doped drain regions, performing a first lightly doped drain annealing process;
    after performing the first lightly doped drain annealing process, forming second lightly doped drain regions, third lightly doped drain regions and fourth lightly doped drain regions in the substrate on two sides of the second gate structure in the first active region, on two sides of the first gate structure in the second active region and on two sides of the second gate structure in the second active region, respectively;
    forming first spacers on the sidewalls of the first and the second gate structures in the first active region and simultaneously forming second spacers on the sidewalls of the first and the second gate structures in the second active region;
    forming first source/drain regions in the substrate on two sides of the first spacers and forming second source/drain regions in the substrate on two sides of the second spacers; and
    performing a source/drain annealing process.

9. The method of fabricating the CMOS transistor of claim 8, wherein the method of the first lightly doped drain annealing process comprises using plasma, laser, rapid thermal processing or furnace.

10. The method of fabricating the CMOS transistor of claim 8, wherein the first lightly doped drain annealing process is performed at an operating temperature between about 500° C. to 900° C.

11. The method of fabricating the CMOS transistor of claim 8, wherein the source/drain annealing process comprises a mini-second annealing process.

12. The method of fabricating the CMOS transistor of claim 11, wherein the mini-second annealing process comprises using plasma, laser or rapid thermal processing.

13. The method of fabricating the CMOS transistor of claim 8, wherein the method of forming the second, the third and the fourth lightly doped drain regions comprises:
    forming the third lightly doped drain regions in the substrate on two sides of the first gate structure in the second active region; and
    forming the second lightly doped drain regions in the substrate on two sides of the second gate structure in the first active region and forming the fourth lightly doped drain regions in the substrate on two sides of the second gate structure in the second active region.

14. The method of fabricating the CMOS transistor of claim 13, wherein, after forming the third lightly doped drain regions, and before forming the second and fourth lightly doped drain regions, further comprises performing a second lightly doped drain annealing process.

15. The method of fabricating the CMOS transistor of claim 14, wherein the second lightly doped drain annealing process comprises using plasma, laser, rapid thermal processing or furnace.

16. The method of fabricating the CMOS transistor of claim 14, wherein the second lightly doped drain annealing process is performed at an operating temperature between about 500° C. to 900° C.

17. The method of fabricating the CMOS transistor of claim 8, wherein, after forming the second, the third and the fourth lightly doped drain regions, and before forming the first and the second spacers, further comprises performing an annealing process.

18. The method of fabricating the CMOS transistor of claim 8, wherein the first gate structure comprises a gate structure of an input/output transistor and the second gate structure comprises a gate structure of a core transistor.

19. The method of fabricating the CMOS transistor of claim 8, wherein the first active region is an N-type active region and the second active region is a P-type active region.

20. A method of fabricating a complementary metal-oxide-semiconductor (CMOS) transistor, comprising:
providing a substrate having an isolation structure already formed thereon, wherein the isolation structure defines a first active region and a second active region;
forming a first gate structure and a second gate structure on the substrate in the first and the second active regions respectively, wherein the first gate structure has a dimension greater than the second gate structure;
forming first lightly doped drain regions in the substrate on two sides of the first gate structure in the first active region and forming second lightly doped drain regions in the substrate on two sides of the first gate structure in the second active region;
after forming the first and the second lightly doped drain regions, performing a lightly doped drain annealing process;
after performing the lightly doped drain annealing process, forming third lightly doped drain regions in the substrate on two sides of the second gate structure in the first active region and forming fourth lightly doped drain regions in the substrate on two sides of the second gate structure in the second active region;
forming first spacers on the sidewalls of the first and the second gate structures in the first active region and simultaneously forming second spacers on the sidewalls of the first and the second gate structures in the second active regions;
forming first source/drain regions in the substrate on two sides of the first spacers and forming second source/drain regions in the substrate on two sides of the second spacers; and
performing a source/drain annealing process.

21. The method of fabricating the CMOS transistor of claim 20, wherein the lightly doped drain annealing process comprises using plasma, laser, rapid thermal processing or furnace.

22. The method of fabricating the CMOS transistor of claim 20, wherein the lightly doped drain annealing process is performed at an operating temperature between about 500° C. to 900° C.

23. The method of fabricating the CMOS transistor of claim 20, wherein the source/drain annealing process comprises a mini-second annealing process.

24. The method of fabricating the CMOS transistor of claim 23, wherein the mini-second annealing process comprises using plasma, laser or rapid thermal processing.

25. The method of fabricating the CMOS transistor of claim 20, wherein, after forming the third and the fourth lightly doped drain regions, and before forming the first and the second spacers, further comprises performing an annealing process.

26. The method of fabricating the CMOS transistor of claim 20, wherein the first gate structure comprises a gate structure of an input/output transistor and the second gate structure comprises a gate structure of a core transistor.

27. The method of fabricating the CMOS transistor of claim 20, wherein the first active region is an N-type active region and the second active region is a P-type active region.

* * * * *